United States Patent
Bogner et al.

(10) Patent No.: US 7,054,600 B2
(45) Date of Patent: May 30, 2006

(54) CHANNEL-SELECTIVE AMPLIFIER WITH TUNABLE FILTER

(75) Inventors: Norbert Bogner, Bavaria (DE); Kai-Uwe Ritter, Bavaria (DE); Horst Schenkel, Bavaria (DE)

(73) Assignee: Lucent Technologies Inc., Murray Hill, NJ (US)

( * ) Notice: Subject to any disclaimer, the term of this patent is extended or adjusted under 35 U.S.C. 154(b) by 551 days.

(21) Appl. No.: 10/119,516

(22) Filed: Apr. 10, 2002

(65) Prior Publication Data

US 2002/0160804 A1    Oct. 31, 2002

(30) Foreign Application Priority Data

Apr. 30, 2001  (EP)  .................................. 01303935

(51) Int. Cl.
  H04B 17/02    (2006.01)
(52) U.S. Cl. .................... 455/135; 455/69; 455/522; 375/138; 375/345
(58) Field of Classification Search ............... 455/522, 455/550.1, 135, 69, 517; 375/138, 345, 347, 375/150, 148, 142, 349
See application file for complete search history.

(56) References Cited

U.S. PATENT DOCUMENTS

| | | | | |
|---|---|---|---|---|
| 3,891,926 A | * | 6/1975 | Ishman et al. | ............... 455/108 |
| 5,193,223 A | * | 3/1993 | Walczak et al. | ......... 455/115.1 |
| 5,475,873 A | | 12/1995 | Konishi | |
| 5,574,747 A | | 11/1996 | Lomp | |
| 6,628,635 B1 | * | 9/2003 | Yano et al. | ................. 370/335 |
| 6,721,350 B1 | * | 4/2004 | Lomp | ......................... 375/130 |
| 6,801,565 B1 | * | 10/2004 | Bottomley et al. | ......... 375/148 |

FOREIGN PATENT DOCUMENTS

EP    0 800 267 A2    10/1997

* cited by examiner

Primary Examiner—Edan Orgad

(57) ABSTRACT

The application relates to transmission power control in transmission systems, in particular mobile radio systems. One object of the invention is to indicate a way of guaranteeing, compared with the state of the art, improved, in particular dynamic, control of transmission powers within predefinable emitted interference requirements with, in particular, increased efficiency and reduced power consumption. For this purpose, the invention provides for the filtering of an amplified transmission signal to be divided up between a narrower-band tunable pre-filter (4) and a broadband post-filter (10). To perform this operation, a signal-amplification circuit is proposed which comprises a tunable filter (4) which is connected downstream of a power amplifier (2).

12 Claims, 2 Drawing Sheets

CHANNEL-SELECTIVE AMPLIFIER WITH TUNABLE FILTER

CROSS REFERENCE TO RELATED APPLICATIONS

This application claims priority of European Application No. 01303935.9 filed on Apr. 30, 2001.

BACKGROUND OF THE INVENTION

1. Field of the Invention

The application relates to a method and a device for controlling the transmission power in transmission systems, in particular in mobile radio systems, and a transceiver device adapted thereto.

2. Description of Related Art

In mobile radio systems, transceiver devices are housed in "cabinets" of base stations (BTS). The base stations are in turn conventionally divided up into a plurality of radio cells, referred to as sectors, one base station normally covering three sectors. A plurality of carriers are available for information transmission for each cell or sector, depending on the communication network which is used. In a UMTS-based network (Universal Mobile Communication System), i.e. a third-generation mobile radio network, there are, for example, a maximum of three carriers available per cell.

If a plurality of carrier frequencies are available per cell, the transmission signals of the various transmission devices are initially combined in a conventional manner via "hybrid combiners" to form one output signal, and are then fed to a common antenna. In order to operate in diversity mode within one cell, two antennas are essentially required per carrier, the antennas normally being designed for transmission and reception. However, in order to ensure transmission and reception via one antenna, "duplexers" are furthermore required in order to separate the transmission and reception frequency bands. One hybrid combiner and in particular one duplexer of one base station therefore conventionally cover the entire available frequency range, i.e. in a UMTS system, this means one frequency range of around 60 MHz for Europe.

However, limits are specified by international standards in respect of stop-band attenuation inside (inband) and outside (out-of-band) the frequency band. Particularly the inband limits in UMTS frequency bands impose demanding requirements in terms of emitted interference. These international standards, such as, in particular, the 3GPP standard for UMTS systems, do not provide for internal frequency subdivision between different network operators. The transmission amplifiers and filters used in current base stations are therefore correspondingly designed in such a way that they cover the entire available frequency band. In a current broadband implementation, the corresponding system parameters must therefore satisfy the critical requirements in both the transmission amplifier and the filter in order to be able to adhere to the prescribed limits, which results in increased production and operating costs.

The associated industrial and ecological disadvantages are all the more significant because network operators operate networks within specific frequency bands ranging over a plurality of mobile radio standards, such as GSM, (Global System for Mobile Communication), UMTS, TDMA (Time Division Multiple Access). Not only transmission devices for broadband UMTS transmission signals, but also transmission devices for narrower-band GSM transmission signals must be provided. In the GSM-based networks too, duplexers are used for this purpose in a manner known per se to separate the transmission and reception bands, along with "filter combiners" with filters which can be tuned over the entire frequency range to combine a plurality of transmission signals.

SUMMARY OF THE INVENTION

One object of the invention is to indicate a way of guaranteeing improved, in particular dynamic, control of transmission powers within predefinable emitted interference requirements with, in particular, increased efficiency and reduced power consumption, while avoiding the aforementioned problems of the state of the art.

The object is achieved according to the invention by a method, a device and a transceiver device with the features of claims 1, 2 and 12.

Advantageous and/or preferred embodiments or further developments are described in the dependent claims.

According to the invention, it is provided for the filtering of an amplified transmission signal to be divided up between a narrower-band tunable pre-filter and a broadband post-filter. Unwanted emissions within the frequency band can thus be contained by the pre-filter, far-off selectivity and, if necessary, separation of the transmission and reception bands by the post-filter. Furthermore, the two filters can be manufactured independently of one another and do not need to be customized.

For this purpose, a device is proposed for controlling the transmission power in transmission systems, in particular in mobile radio systems, which comprises a signal-amplification circuit with a power amplifier and a downstream tunable filter.

By providing a tunable filter within the signal-amplification circuit, channel-selective amplifiers can be implemented which have substantially higher efficiency with reduced power consumption and therefore lower costs. Furthermore, the device according to the invention is suitable for mass production, so that production costs can be substantially reduced.

In addition, the tunable filter protects the power amplifier against signals from other signal amplifiers which arrive from the output and which operate on the same antenna and could generate intermodulation, as a result of which the requirements for a circulator disposed at the power amplifier output are substantially reduced.

In order to further increase efficiency and ensure essentially linear transmission signal amplification with minimal impact on the environment in terms of interference signals, which are referred to as "spurious emissions", it is provided according to a preferred embodiment of the invention to connect a digital predistortion device upstream of the power amplifier.

If the predistortion device is appropriately designed as an adaptive device, an otherwise frequency-dependent transmission curve of the tunable filter can be compensated through feedback of the signal extracted at the output of the signal-amplification circuit and the flatness requirements of the transmission curve can thus be reduced.

In a practical design, it is provided for this purpose for the extracted signal to be fed following demodulation via a correlation device to the predistortion device to carry out a setpoint/actual-value comparison of the transmission signal. In addition, the processing bandwidth of the digital predistortion device can thereby be substantially reduced in an advantageous manner, which in turn results in cost reductions.

In a further preferred embodiment, the power amplifier and the tunable filter are accommodated in a housing, thereby guaranteeing frequency association via short connection paths between the output transmission power and downstream filtering. Power loss and cabling costs can thus be further minimized and adaptation problems can essentially be excluded.

According to a preferred embodiment, the frequency-dependent settings of the tunable filter can be incorporated in a type of table which can be addressed in a manner known per se according to the required pass-band frequency, wherein, in an appropriate further development, the filter can be adjusted in a simple manner via electronic and/or electromechanical setting elements.

In an alternative embodiment, it is provided for the tunable filter to be adjusted in response to a minimum return power, whereby tolerances, in particular as a result of ageing and/or temperature fluctuations, can be compensated, thereby guaranteeing essentially more effective and prolonged overall usability.

The solution according to the invention therefore ensures an overall increase in the efficiency of the power amplifier, which in turn results in reduced power loss and takes up less space compared with conventional feed-forward amplifiers. In addition, production and logistics costs in particular can be reduced by dividing up the filtering.

According to particularly appropriate embodiments, the device according to the invention forms part of a transceiver device which switches a plurality of transmission signals together onto a common antenna and is disposed in a preferred manner in a base station, in particular of a UMTS-based network.

BRIEF DESCRIPTION OF THE DRAWINGS

The invention is described in detail below using examples, with reference to two preferred embodiments and the attached drawings, wherein.

DETAILED DESCRIPTION

Figure 1:
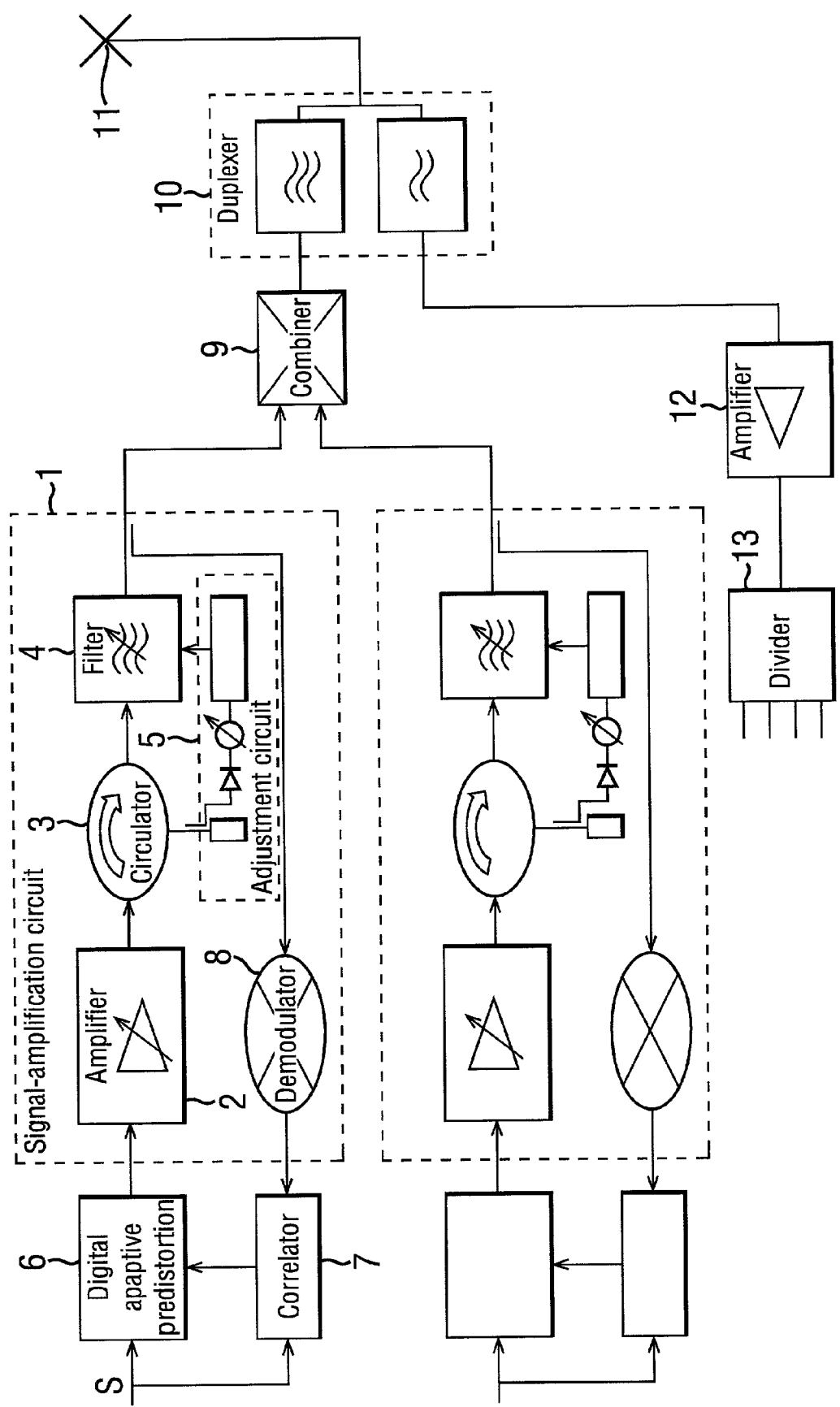
FIG. 1 shows a first embodiment of the invention, in which two amplified output signal powers are switched together onto one antenna using a hybrid combiner.

Reference is made below initially to FIG. 1, which shows a simplified block diagram of a transceiver device with two devices according to the invention for controlling the transmission powers, which operate on an antenna via a hybrid-combiner-duplexer arrangement. According to the present embodiment, the transceiver device is integrated into a base station of a UMTS-based mobile radio system, in which the two devices shown in FIG. 1, each having a channel-selective signal-amplification circuit, correspond to one another. Consequently, the following description referring to one control device also applies accordingly to the parallel-connected second device.

According to FIG. 1, a channel-selective signal-amplification circuit comprises a power amplifier 2 and a tunable filter 4 connected downstream of the power amplifier 2, which are disposed within a housing 1. The power amplifier 2 and the filter 4 are interconnected via a circulator 3. Furthermore, to adjust the filter 4, an adjustment circuit 5 is connected to the circulator 3 and the filter 4 in such a way that a required pass-band frequency can be set, with minimization of the return power in a manner known per se to the person skilled in the art in this domain. An adjustment of this type is preferred since tolerances due in particular to ageing and/or environmental effects, for example due to the ambient temperature, can be compensated.

A digital adaptive predistortion stage 6, which is connected downstream of the power amplifier 2, first forwards the signal S arriving from a baseband processing unit (not shown), in which user/control data to be transmitted are embedded.

Furthermore, the signal amplification circuit has a correlation device 7, to which the signal S is similarly fed. Furthermore, the radio-frequency output signal present at the output of the filter 4 is extracted by means of an open control loop and is delivered via a demodulation device 8 and the correlation unit 7. The output signal of the correlation device 7 is fed back to the digital predistortion stage 5.

The signal present at the output of the filter 4 is furthermore switched, together with the corresponding output signal of the second (shown) signal amplification circuit, via a hybrid combiner 9 and a duplexer 10 to a common antenna 11. The broadband duplex filter 10 essentially forwards the complete frequency range in the transmission frequency band which is specifically permitted for the relevant transmission system and, in a manner known to the person skilled in the art, guarantees the suppression of unwanted emitted interference outside the permitted frequency band and separation between the transmitter and receiver. The reception band is switched from the duplexer 10 to an amplifier 12 and a dividing unit 13 in order to divide combined reception signals.

The mode of operation of the signal-amplification circuit according to the invention is essentially as follows:

The signal S arriving via the baseband signal processing unit (not shown) and containing the user/control data is initially fed to the adaptive predistortion unit 6, the predistortion curve being adaptively adjusted through correlation of the setpoint signal S with the extracted and demodulated actual signal. The conventionally frequency-dependent transmission curve of the filter 4 can thus already be compensated with the adaptive predistortion stage, whereby the requirements for the flatness of the transmission curve of the tunable filter 4 used for channel selection are reduced. Consequently, substantially improved discrimination or selection of the modulated radio-frequency signal can consequently be achieved by means of the filter 4 which, in contrast to the duplex filter 10, is of narrower-band design, and the predistortion 6.

Reduction of the requirements in terms of crest factor reduction and filtering is furthermore enabled, so that essentially linear amplification of the signal S in the power amplifier 2 is achieved and it is simultaneously ensured that the environment is essentially unaffected by interference signals, referred to as "spurious emissions".

In addition, the processing bandwidth of the predistortion 6 can be reduced through feedback of the baseband signal recovered from the RF output signal by means of the open control loop.

If a reduction in interference in ±2 adjacent channels is normally required, and if the bandwidth of one channel is, for example, 5 MHz, a processing bandwidth of 25 MHz is therefore required. If, after setting the tunable filter 4, the post-filtering is designed in such a way that a stop-band effect is achieved in relation to the outer adjacent channels, i.e. the outer adjacent channels are filtered, the processing bandwidth of the adaptive predistortion 6 can be reduced, for example, to ±1 channel, so that the processing bandwidth of the predistortion 6 is reduced to 15 MHz.

In addition, due to the stop-band effect of the downstream channel-selective filter 4, the power amplifier 2 is protected against signals from other power amplifiers which arrive from the output and which may operate on the same antenna 11 and generate intermodulation, whereby the requirements for the circulator 3 at the output of the power amplifier 2 are additionally reduced.

As a result of the arrangement of the power amplifier 2 and the tunable filter 4 in a common housing 1, frequency association between the power amplifier 2 and the filter 4 is furthermore guaranteed. Due to the furthermore associated short connection paths between the output of the power amplifier 2 and the input of the filter 4, the power loss, adaptation problems and the cost of cabling between both devices can consequently also be minimized.

In respect of the design of the filter 4, the number of filter pole positions to be used is essentially dependent on the requirement for the stop-band attenuation of the radio-frequency signal within a specific frequency range. However, it can be assumed that the filtering in the tunable filter is moderate, i.e., for example, 20 dB with two-channel spacing, and normally has only a few, for example two, filter poles. In order to minimize the power loss of the filter 4, in particular heat losses, it is provided for high-quality filters to be used, for example cavity filters comprising ceramic and/or silver-coated metal.

Due to the division of filtering between the narrowband tunable filter 4 and the broadband external filter, in the present embodiment the duplex filter 10, both filter units can be manufactured independently of one another and do not need to be customized. The tunable filter 4 is provided for suppression of unwanted in-band emissions and the duplex filter 10 is provided for separation between the transmitter and the receiver, for far-off selection and for suppression of emitted interference outside the permitted band, as a result of which the filter requirements for the duplexer 10 are very high.

On the other hand, as a result of the signals pre-filtered by the channel-selecting filter 4, no requirements are imposed on the duplex filter 10 in terms of stop-band attenuation within the UMTS frequency band. Both filters, i.e. the tunable pre-filter 2 and the broadband filter 10, are appropriately designed in such a way that they can cover the entire frequency range.

If a plurality of channel-filtered radio-frequency signals are switched jointly onto one antenna, these signals may, as shown in FIG. 1, be combined by means of a hybrid combiner 9 known per se.

Figure 2:
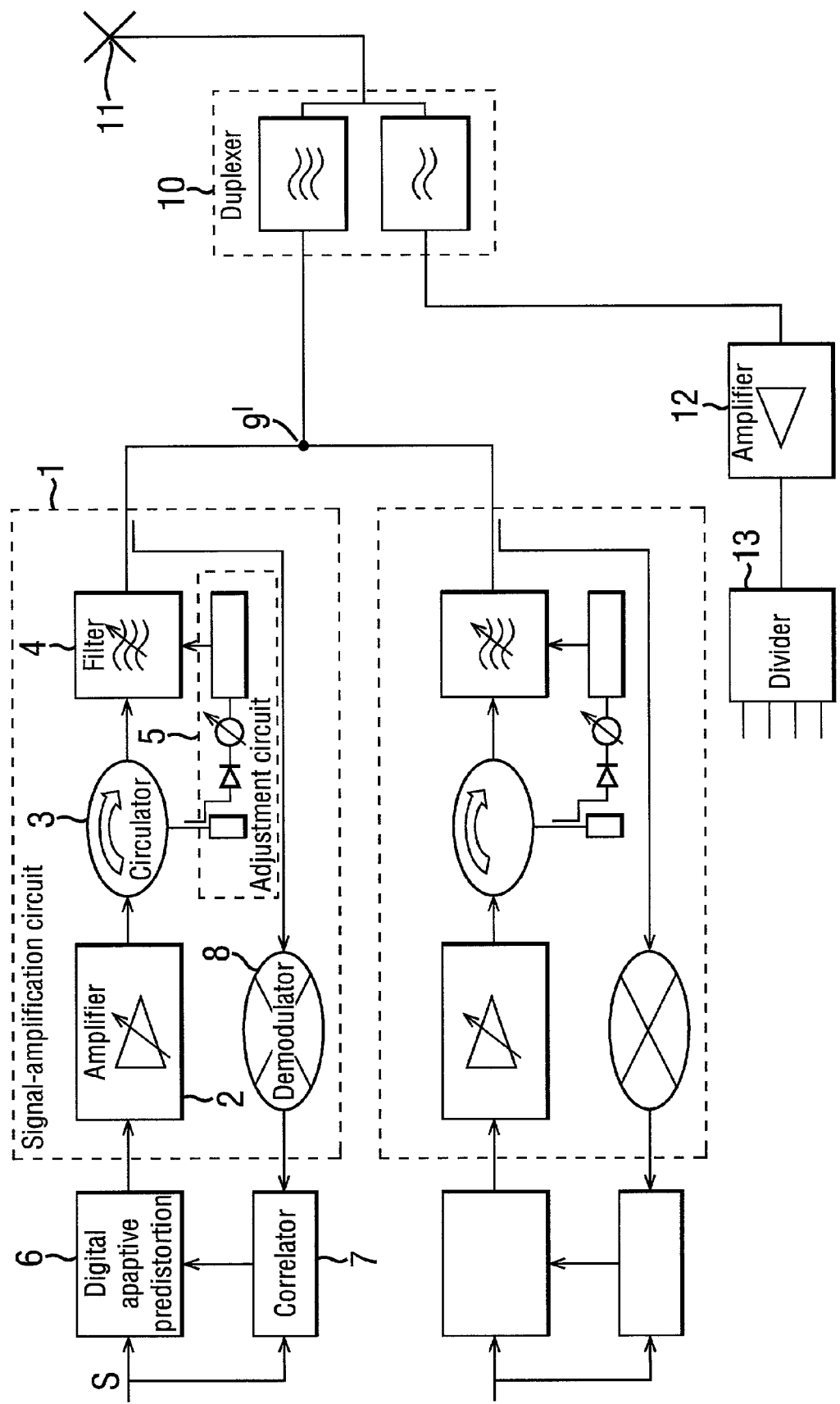
FIG. 2 shows an embodiment, comparable to FIG. 1, in which, however, a star connection is used instead of the hybrid combiner for combination.

According to the embodiment presented in FIG. 2, which shows a circuit arrangement comparable to FIG. 1, so that similar or similarly-acting elements are indicated with the same reference symbols and are consequently not further described, it is, however, also possible to use, for example, a star connection 9' instead of a hybrid combiner according to FIG. 1 in order to combine a plurality of channel-filtered radio-frequency signals. Compared with combination by means of a hybrid combiner 9 as shown in FIG. 1, which essentially always entails a power loss of around 3 dB, the power loss can be reduced by around 2.5 dB through combination by means of the star connection 9'. This is possible since the tunable filters 4 have a high impedance outside the defined pass-band range and therefore have a blocking effect outside the selected pass-band frequency. The different transmission frequencies of interconnected transmitters do not therefore impose a burden on the respective other filter output. Similarly, in the embodiment according to FIG. 2, the intermediate connection of a duplex filter 10 is required in order to combine the transmitter and receiver signals via the common antenna 11.

The invention furthermore comprises embodiments in which the frequency-dependent settings for adjusting the tunable filter 4 are stored in a memory or in a table, which can be addressed via the required pass-band frequency. The filter 4 can furthermore be adjusted in a simple and therefore low-cost design via electronic or electromechanical setting elements. Finally, application of the invention is not restricted to UMTS-based systems, but can also be applied in a corresponding manner to transmission systems of other standards, in particular based on GSM and/or TDMA. Furthermore, the combination of different standards is also covered by the invention.

The invention claimed is:

1. Device for controlling the transmission power in transmission systems, in particular mobile radio systems, with a signal-amplification circuit comprising:
   a power amplifier and a downstream tunable filter; and
   a digital predistortion device connected upstream of the power amplifier, wherein the output signal of the channel-selective tunable filter is extracted with the formation of an open control loop and is fed following demodulation via a device to the predistortion device in order to carry out a setpoint/actual-value comparison of the transmission signal.

2. Device according to claim 1, comprising:
   a broadband filter connected downstream of the signal-amplification circuit.

3. Device according to claim 1, comprising:
   predefinable pass-band frequency-specific settings of the tunable filter being stored in a table.

4. Device according to claim 1, wherein the filter can be adjusted by electronic and/or electromagnetic setting elements to a predefinable pass-band frequency.

5. Device according to claim 1, wherein the filter can be adjusted with minimization of the return power.

6. Device according to claim 1, wherein adaptive adjustment of the predistortion device can be carried out by means of the output signal of the channel-selective tunable filter.

7. Transceiver device of a transmission system, in particular a mobile radio system, comprising at least two devices according to claim 1, which are interconnected at the outputs of their signal-amplification circuits.

8. Transceiver device according to claim 7, wherein a duplex filter is provided as the downstream filter, via which the output signals are switched to an antenna.

9. Transceiver device according to claim 7, wherein it forms part of a base station, in particular a UMTS-based mobile radio network.

10. Transceiver device according to claim 7 in which said at least two devices are interconnected at the outputs of their signal-amplification circuits via a hybrid combiner or a star connection.

11. Transceiver device of a transmission system, in particular a mobile radio system, comprising at least two devices according to claim 1, the outputs of the signal-amplification circuits being interconnected so as to provide a combined signal to a broadband filter.

12. Transceiver device according to claim 11, in which the signal-amplification circuits are channel selective.

* * * * *